US011889695B2

(12) United States Patent
Tessariol et al.

(10) Patent No.: US 11,889,695 B2
(45) Date of Patent: Jan. 30, 2024

(54) DEVICE, A METHOD USED IN FORMING A CIRCUIT STRUCTURE, A METHOD USED IN FORMING AN ARRAY OF ELEVATIONALLY-EXTENDING TRANSISTORS AND A CIRCUIT STRUCTURE ADJACENT THERETO

(71) Applicant: Micron Technology, Inc., Boise, ID (US)

(72) Inventors: Paolo Tessariol, Arcore (IT); Justin B. Dorhout, Boise, ID (US); Indra V. Chary, Boise, ID (US); Jun Fang, Boise, ID (US); Matthew Park, Boise, ID (US); Zhiqiang Xie, Meridian, ID (US); Scott D. Stull, Boise, ID (US); Daniel Osterberg, Boise, ID (US); Jason Reece, Boise, ID (US); Jian Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 148 days.

(21) Appl. No.: 17/504,313

(22) Filed: Oct. 18, 2021

(65) Prior Publication Data

US 2022/0037360 A1    Feb. 3, 2022

Related U.S. Application Data

(62) Division of application No. 15/705,179, filed on Sep. 14, 2017, now Pat. No. 11,177,271.

(51) Int. Cl.
| | |
|---|---|
| H01L 27/11582 | (2017.01) |
| H10B 43/27 | (2023.01) |
| H01L 21/768 | (2006.01) |
| H01L 21/311 | (2006.01) |
| H01L 23/528 | (2006.01) |
| H01L 21/02 | (2006.01) |

(Continued)

(52) U.S. Cl.
CPC ....... H10B 43/27 (2023.02); H01L 21/02636 (2013.01); H01L 21/31111 (2013.01);
(Continued)

(58) Field of Classification Search
CPC ........ H10B 43/27; H10B 41/27; H10B 43/40; H10B 43/50; H10B 41/41; H10B 41/50
See application file for complete search history.

(56) References Cited

U.S. PATENT DOCUMENTS

| | | |
|---|---|---|
| 8,945,996 B2 | 2/2015 | Tang et al. |
| 9,589,978 B1 | 3/2017 | Yip |

(Continued)

OTHER PUBLICATIONS

CN CN 201811003989.6 Search Rept., dated Nov. 24, 2022, Micron Technology, Inc.

*Primary Examiner* — Younes Boulghassoul
*Assistant Examiner* — Quinton A Brasfield
(74) *Attorney, Agent, or Firm* — Wells St. John P.S.

(57) ABSTRACT

A device comprises an array of elevationally-extending transistors and a circuit structure adjacent and electrically coupled to the elevationally-extending transistors of the array. The circuit structure comprises a stair step structure comprising vertically-alternating tiers comprising conductive steps that are at least partially elevationally separated from one another by insulative material. Operative conductive vias individually extend elevationally through one of the conductive steps at least to a bottom of the vertically-alternating tiers and individually electrically couple to an electronic component below the vertically-alternating tiers. Dummy structures individually extend elevationally through one of the conductive steps at least to the bottom of the vertically-alternating tiers. Methods are also disclosed.

22 Claims, 16 Drawing Sheets

(51) Int. Cl.
  *H01L 29/10* (2006.01)
  *H01L 23/522* (2006.01)
  *H10B 41/27* (2023.01)
  *H10B 43/50* (2023.01)
  *H10B 41/35* (2023.01)
  *H10B 43/10* (2023.01)

(52) U.S. Cl.
  CPC .. *H01L 21/76802* (2013.01); *H01L 21/76877* (2013.01); *H01L 21/76895* (2013.01); *H01L 23/528* (2013.01); *H01L 23/5226* (2013.01); *H01L 29/1037* (2013.01); *H10B 41/27* (2023.02); *H10B 41/35* (2023.02); *H10B 43/50* (2023.02); *H10B 43/10* (2023.02)

(56) References Cited

U.S. PATENT DOCUMENTS

| | | | |
|---|---|---|---|
| 9,627,403 B2 | 4/2017 | Liu et al. | |
| 9,876,031 B1 | 1/2018 | Shimizu et al. | |
| 9,960,181 B1 | 5/2018 | Cui et al. | |
| 2010/0224962 A1 | 9/2010 | Kim | |
| 2011/0121403 A1* | 5/2011 | Lee | H10B 41/27 257/E27.06 |
| 2012/0306090 A1 | 12/2012 | Smith et al. | |
| 2013/0161821 A1* | 6/2013 | Hwang | H10B 43/27 257/E21.585 |
| 2015/0129878 A1 | 5/2015 | Shin et al. | |
| 2015/0129935 A1 | 5/2015 | Tang et al. | |
| 2015/0179660 A1 | 6/2015 | Yada et al. | |
| 2015/0179662 A1 | 6/2015 | Makala et al. | |
| 2016/0322381 A1 | 11/2016 | Liu et al. | |
| 2017/0141032 A1* | 5/2017 | Lee | H10B 43/27 |
| 2017/0179151 A1 | 6/2017 | Kai et al. | |
| 2017/0236746 A1* | 8/2017 | Yu | H10B 43/40 257/314 |
| 2017/0352678 A1* | 12/2017 | Lu | H10B 43/10 |
| 2017/0358594 A1 | 12/2017 | Lu et al. | |
| 2018/0301374 A1 | 10/2018 | Masamori et al. | |
| 2018/0350825 A1* | 12/2018 | Ogawa | H10B 43/50 |

* cited by examiner

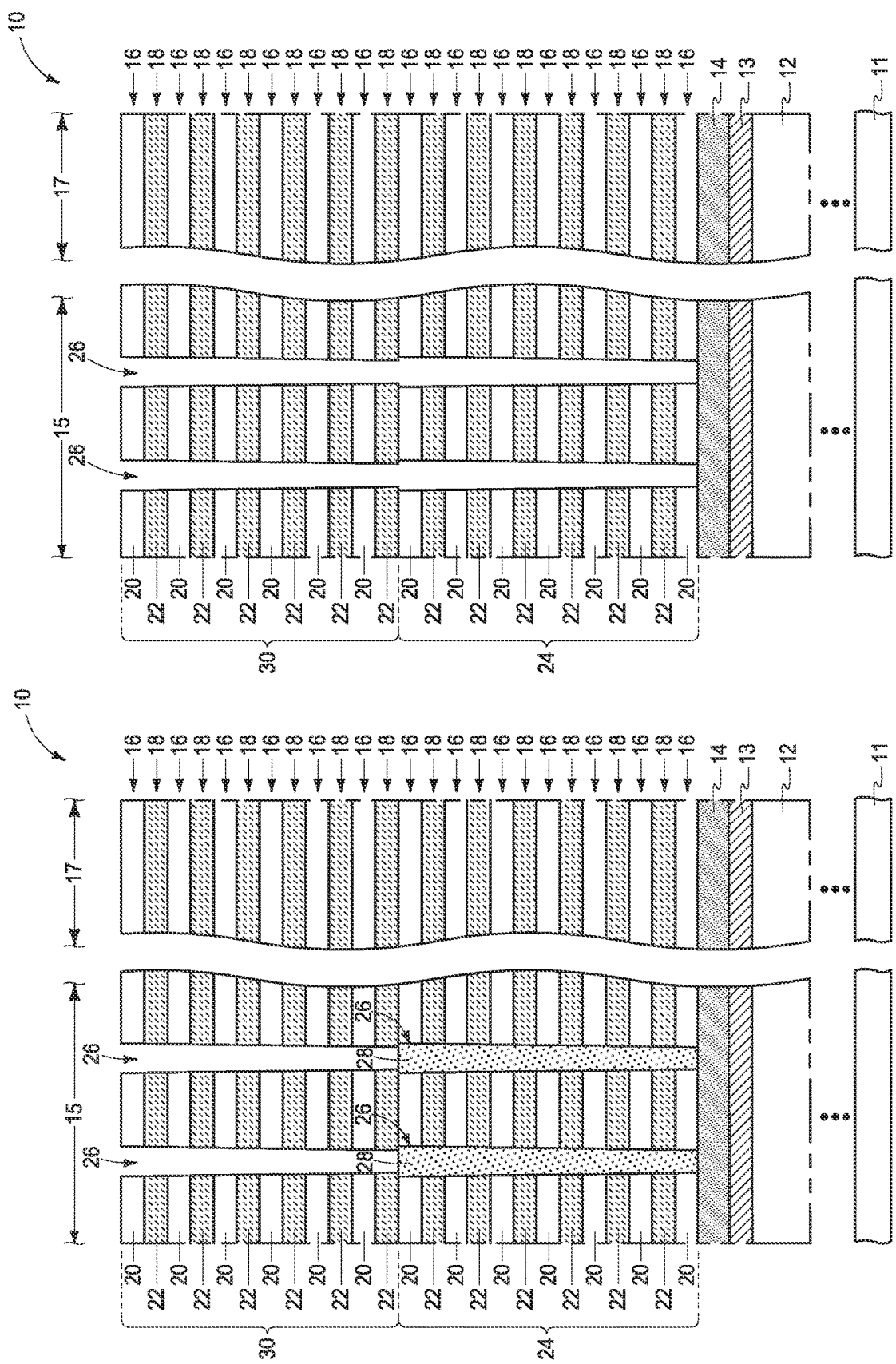

DEVICE, A METHOD USED IN FORMING A CIRCUIT STRUCTURE, A METHOD USED IN FORMING AN ARRAY OF ELEVATIONALLY-EXTENDING TRANSISTORS AND A CIRCUIT STRUCTURE ADJACENT THERETO

RELATED PATENT DATA

This patent resulted from a divisional of U.S. patent application Ser. No. 15/705,179 filed Sep. 14, 2017, which is hereby incorporated by reference herein.

TECHNICAL FIELD

Embodiments disclosed herein pertain to devices, to methods used in forming a circuit structure, and to methods used in forming an array of elevationally-extending transistors and a circuit structure adjacent thereto.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates, and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor.

Vertical transistors may be formed in arrays not necessarily constituting memory cells.

BRIEF DESCRIPTION OF THE DRAWINGS

FIG. 3 is a view of the FIG. 2 construction at a processing step subsequent to that shown by FIG. 2.

FIG. 4 is a view of the FIG. 3 construction at a processing step subsequent to that shown by FIG. 3.

DETAILED DESCRIPTION OF EXAMPLE EMBODIMENTS

Embodiments of the invention encompass devices, methods used in forming a circuit structure, and methods used in forming an array of elevationally-extending transistors and a circuit structure adjacent thereto. Method embodiments are initially described with reference to FIGS. 1-18.

Figure 1:
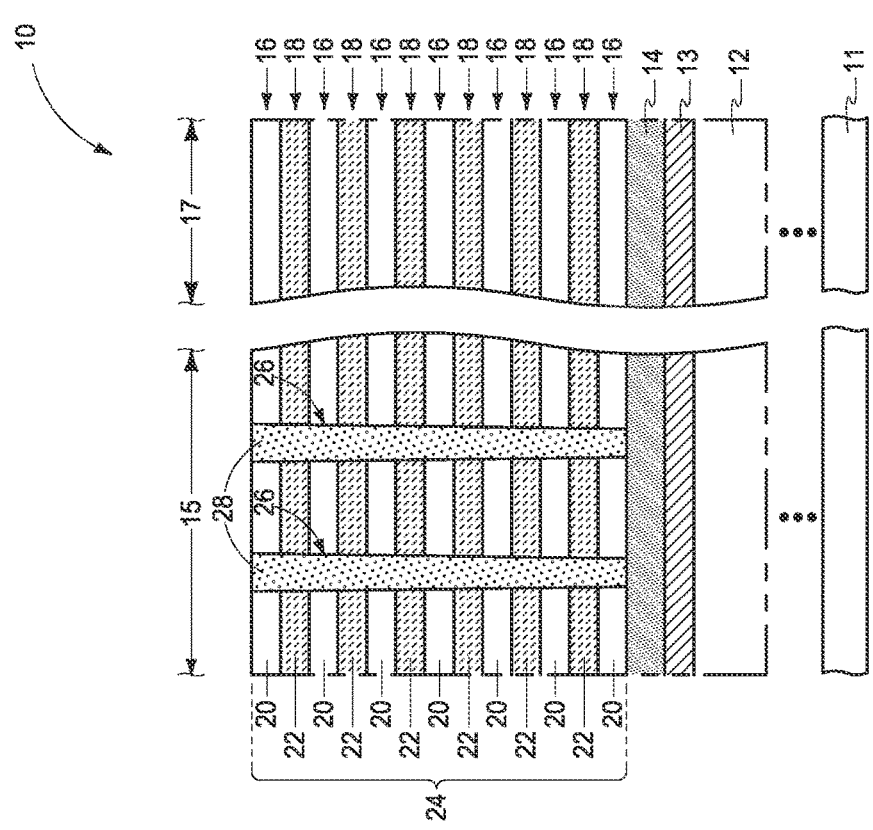
FIG. 1 is a diagrammatic cross-sectional view of a portion of a substrate construction in process in accordance with an embodiment of the invention.

Referring to FIG. 1, a construction 10 comprises a base substrate 11 that may include any one or more of conductive/conductor/conducting (i.e., electrically herein), semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIG. 1-depicted materials. For example, other partially or wholly fabricated components of integrated circuitry may be provided somewhere above, about, or within base substrate 11. Control and/or other peripheral circuitry for operating components within an array of transistors may also be fabricated, and may or may not be wholly or partially within a transistor array or sub-array. Further, multiple sub-arrays may also be fabricated and operated independently, in tandem, or otherwise relative one another. As used in this document, a "sub-array" may also be considered as an array. Above base substrate 11 are example substrate material 12 (e.g., insulating material and/or semiconductor material), conductive material 13 (e.g., metal material), and conductively-doped source material 14 (e.g., conductively-doped semiconductor material). Such materials may comprise a portion of circuitry for an array of elevationally-extending transistors being fabricated in accordance with an example embodiment.

Embodiments of the invention encompass methods used in forming an array of elevationally-extending transistors and a circuit structure adjacent thereto. Some such methods comprise forming vertically-alternating tiers of different composition first and second materials, with the vertically-alternating tiers comprising an array portion and a portion adjacent the array portion. FIG. 1 shows part of an example array portion 15 and part of an example adjacent portion 17. Some such methods may form only a single stack/deck of such vertically-alternating tiers. Alternately, some such methods may form multiple stacks or decks of such vertically-alternating tiers. The discussion largely proceeds with a fabrication method forming two stacks.

Vertically-alternating tiers 16 and 18 of different composition first and second materials 20 and 22, respectively, have been formed relative to or above base substrate 11. In one embodiment, such may be considered as a first stack 24 of vertically-alternating tiers 16 and 18 of different composition materials one of which (material 22) comprises first sacrificial material. Construction 10 is shown as having thirteen vertically-alternating tiers 16 and 18 although fewer or likely many more (e.g., dozens, hundreds, etc.) may be formed. Accordingly, more tiers 16 and 18 may be below the depicted tiers and above base substrate 11 and/or more tiers 16 and 18 may be above the depicted tiers. First material 20 comprises insulative material as some or all of such remains in a finished construction of the array and electrically isolates certain features elevationally between different tiers 16. Second material 22 may be wholly sacrificial, and if so may comprise any one or more of conductive, semiconductive, and insulative materials. One example first material 20 is silicon dioxide, and one example second material 22 is silicon nitride. Such may be formed to be of the same or different thicknesses relative one another, and each need not be of the same respective thickness within the example depicted stack of materials 20, 22.

Elevationally-extending channel openings 26 have been formed into vertically-alternating tiers 16 and 18 in first stack 24. Example techniques for doing so include photolithographic patterning and etch with or without pitch multiplication. Channel openings 26 may be of any suitable shape in horizontal cross-section (not shown), for example circular, ellipsoidal, square, rectangular, etc. Subsequently, such channel openings are shown as having been filled with second sacrificial material 28 (e.g., any suitable insulative, semiconductive, and/or conductive material that may be etched selectively relative to materials 20 and 22).

Figure 2:
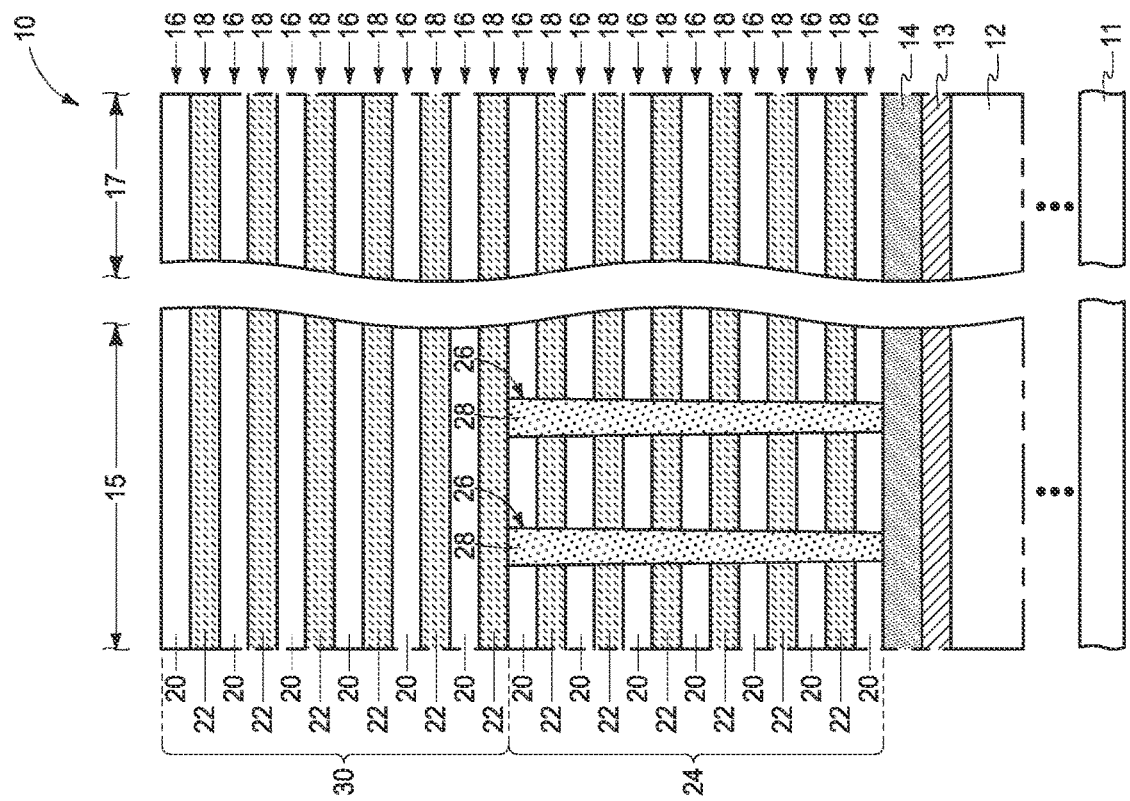
FIG. 2 is a view of the FIG. 1 construction at a processing step subsequent to that shown by FIG. 1.

Referring to FIG. 2, a second stack 30 of vertically-alternating tiers 18, 16 of different composition materials 22, 20 has been formed over first stack 24, with one of such materials (e.g., material 22) comprising and/or referred to as third sacrificial material in some embodiments. The third sacrificial material may be of the same composition as or different composition from the first sacrificial material of first stack 24. As well, material 20 in second stack 30 may be of the same composition as or different composition from that of material 20 in first stack 24. Ideally, materials 20 and 22 are of the same relative compositions with respect to one another in first stack 24 and second stack 30 as inherently indicated using like numerals 20 and 22 in each stack 24 and 30, and whereby there is no additional structure or material identifying an interface of first stack 24 with second stack 30.

Referring to FIG. 3, channel openings 26 have been formed into vertically-alternating tiers 16, 18 in second stack 30 and individually elevationally extend to a different one of channel openings 26 in first stack 24 having second sacrificial material 28 therein. Subsequently, as shown in FIG. 4, second sacrificial material 28 (not shown) has been removed from channel openings 26 in first stack 24 through channel openings 26 in second stack 30. Ideally, such is conducted using any suitable wet or dry etch that etches material 28 (not shown) selectively relative to materials 20 and 22.

Figure 5:
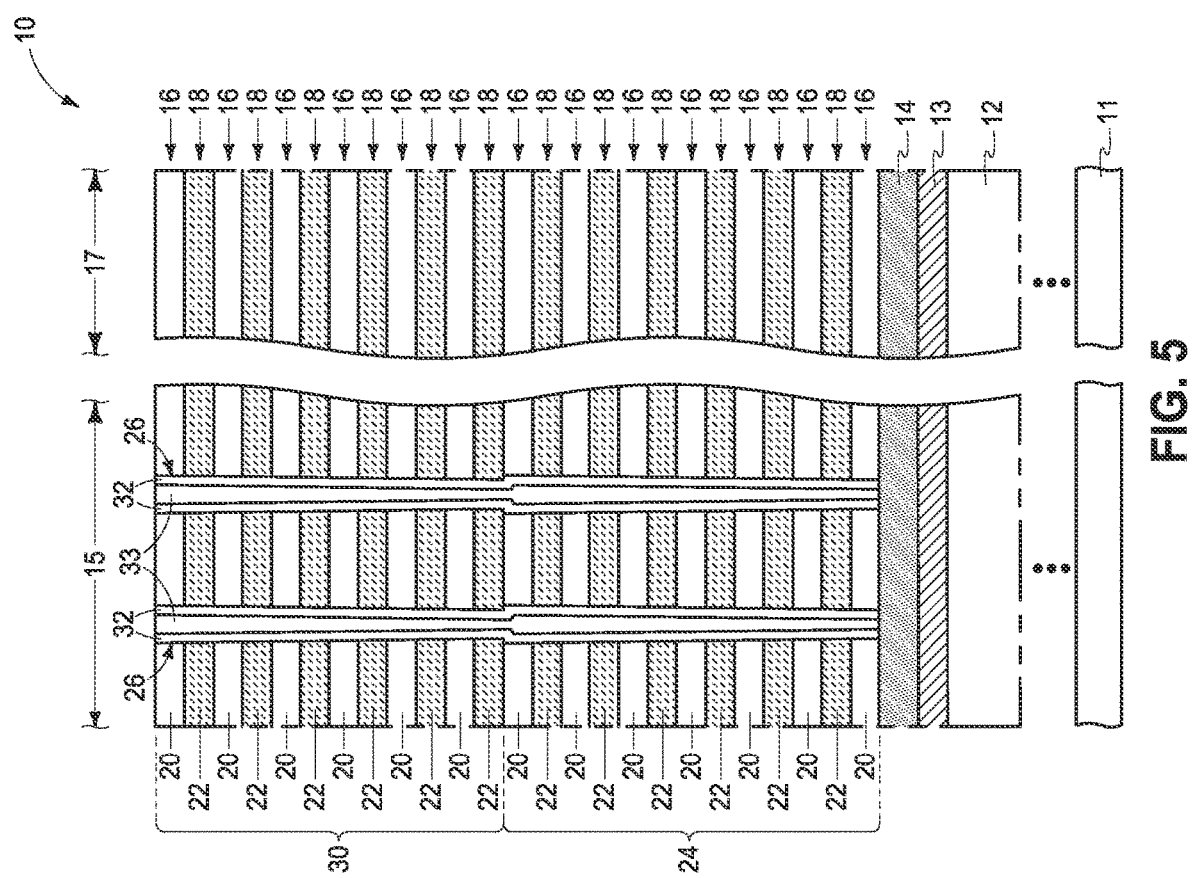
FIG. 5 is a view of the FIG. 4 construction at a processing step subsequent to that shown by FIG. 4.

Referring to FIG. 5, transistor material 32 has been formed in individual channel openings 26 in each of first stack 24 and second stack 30. Such may comprise, for example and in order of deposition, a charge-blocking material (e.g., silicon dioxide and/or silicon nitride), a charge-storage material (e.g., floating gate material such as doped or undoped silicon, etc. or charge-trapping material such as silicon nitride, metal dots, etc.), a charge-passage material (e.g., a bandgap-engineered structure having nitrogen-containing material such as silicon nitride laterally sandwiched between two insulating oxide layers such as silicon dioxide), and transistor channel material (e.g., suitably doped polysilicon, etc.). Material 22 may be laterally recessed back (not shown) from original channel openings 26 prior to deposition of the example charge-blocking material. Central portions of channel openings 26 may be filled with transistor material (not shown), solid insulator material 33, or be hollow (not shown).

Figure 6:
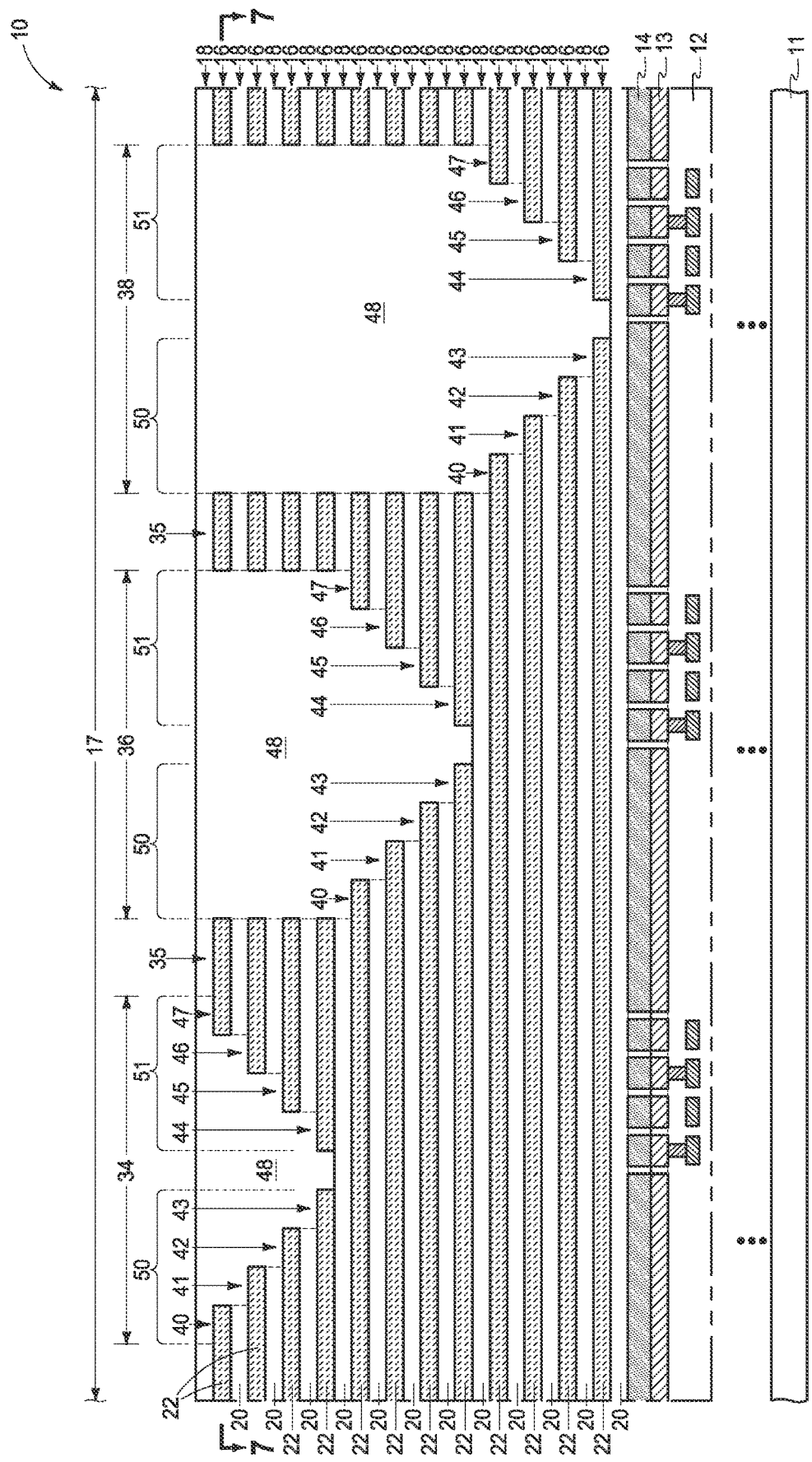
FIG. 6 is a diagrammatic cross-sectional view of a portion of the substrate construction in process in accordance with an embodiment of the invention, and is taken through line 6-6 in FIG. 7.
Figure 7:
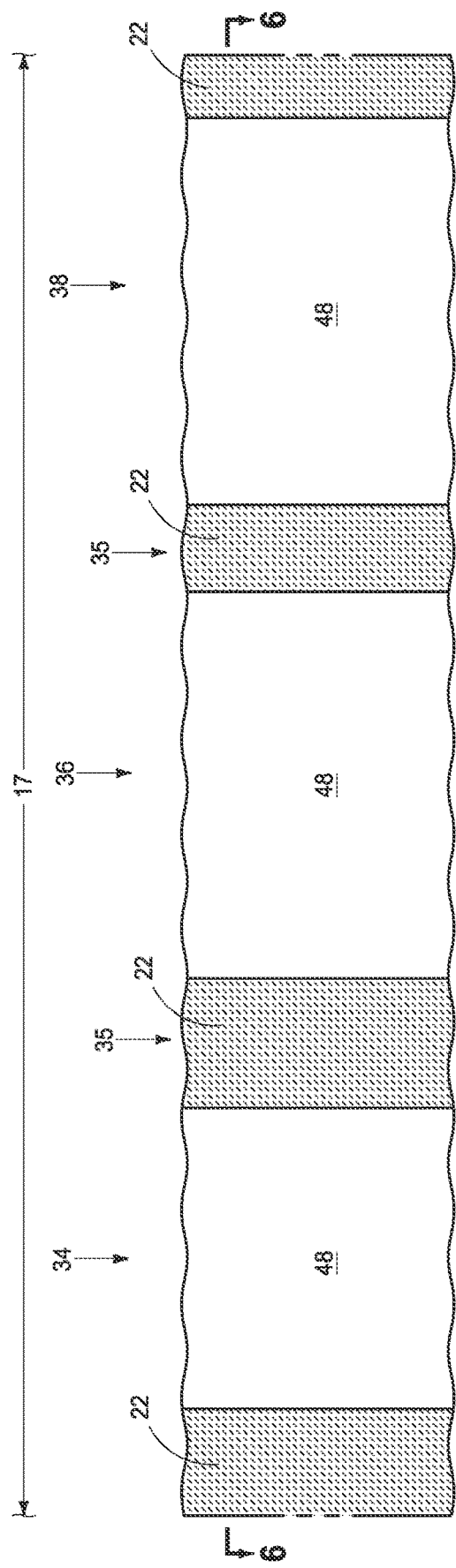
FIG. 7 is a diagrammatic cross-sectional view taken through line 7-7 in FIG. 6.

A stair step structure is formed which comprises steps individually comprising one of the first sacrificial material or the second sacrificial material above one of the other different composition materials of the first or second stack. FIGS. 6 and 7 show an expanded, yet reduced-scale, version of adjacent portion 17 as comprising three stair step structures 34, 36, and 38, with immediately adjacent of such stair step structures being separated from one another by an elevationally-outer landing 35. Stair step structures 34, 36, and 38 individually comprise steps 40, 41, 42, 43, 44, 45, 46, and 47 comprising example second material 22 above first material 20. Fewer or more steps may be formed. Additionally, only one stair step structure, two stair step structures, or more than three stair step structures may be formed. Such may be formed by any suitable existing or yet-to-be-developed technique, with photolithographic patterning and etch being one example. An insulating material 48 (e.g., silicon dioxide and/or silicon nitride) is above steps 40-47.

In one embodiment and as shown, stair step structures 34, 36, and 38 individually comprise opposing first and second sets/flights 50, 51, respectively, of steps 40-47. Alternately, by way of examples only, only one flight of steps may be formed, more than two flights may be formed, and if multiple flights of steps are formed such may not be (not shown) of the same shape, configuration, and/or number of steps relative one another. Regardless, and as shown, stair step structures 34, 36, and 38 individually may define a stadium (e.g., a recessed portion) while landings 35 may define a crest between immediately adjacent stadiums.

The stair step structure(s) may be formed before or after forming channel openings 26 and before or after forming transistor channel material in the individual channel openings.

Figure 8:
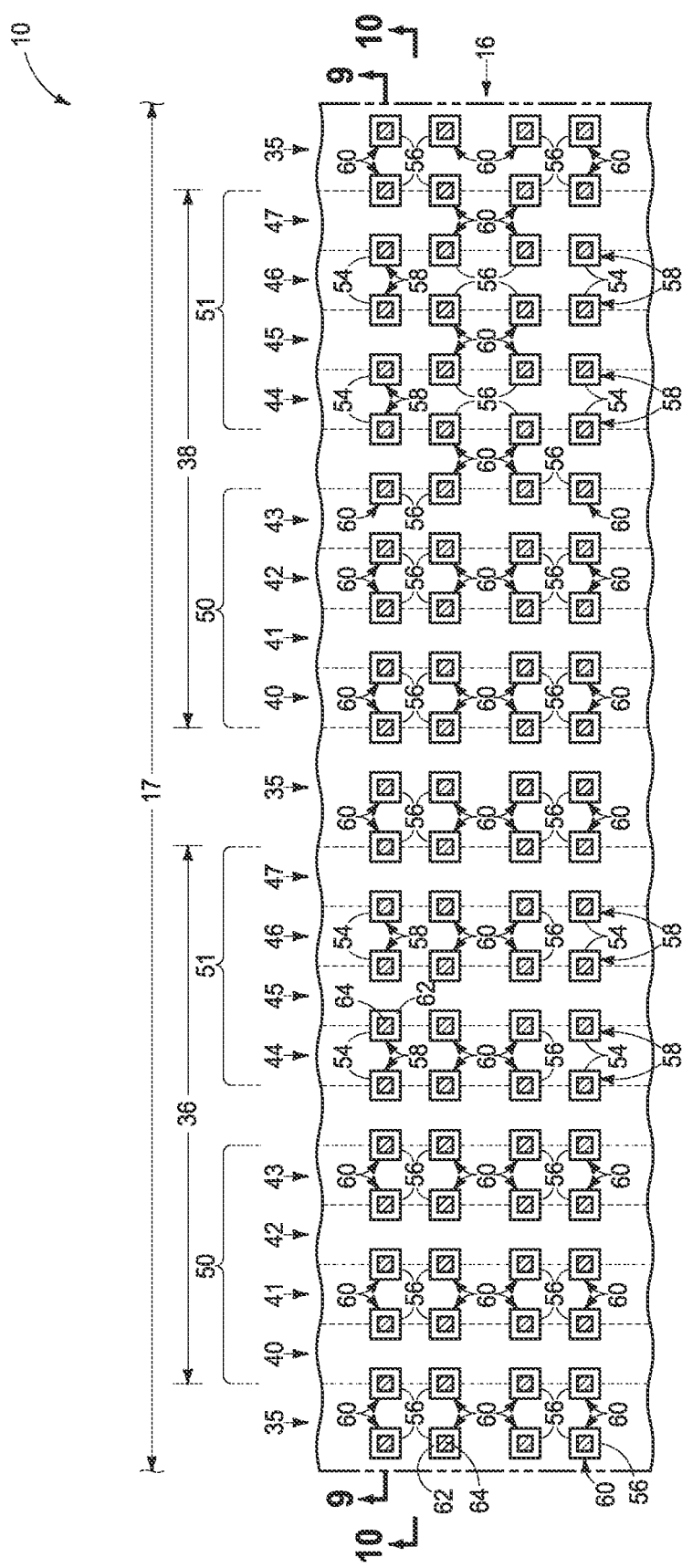
FIG. 8 is a view of a portion of the FIGS. 6 and 7 construction at a processing step subsequent to that shown by FIGS. 6 and 7, and is taken through line 8-8 in FIGS. 9 and 10.
Figure 9:
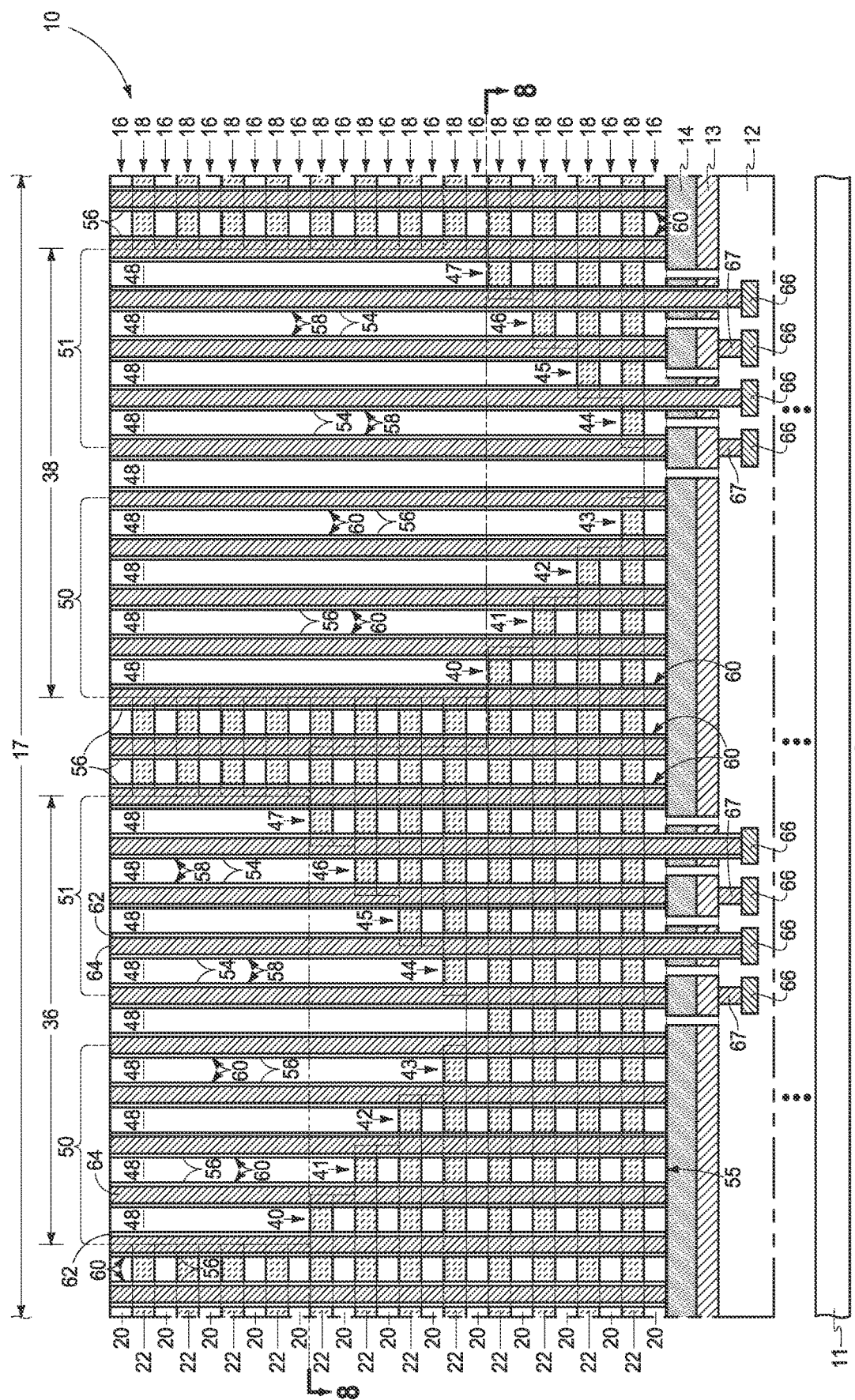
FIG. 9 is a view taken through line 9-9 in FIG. 8.
Figure 10:
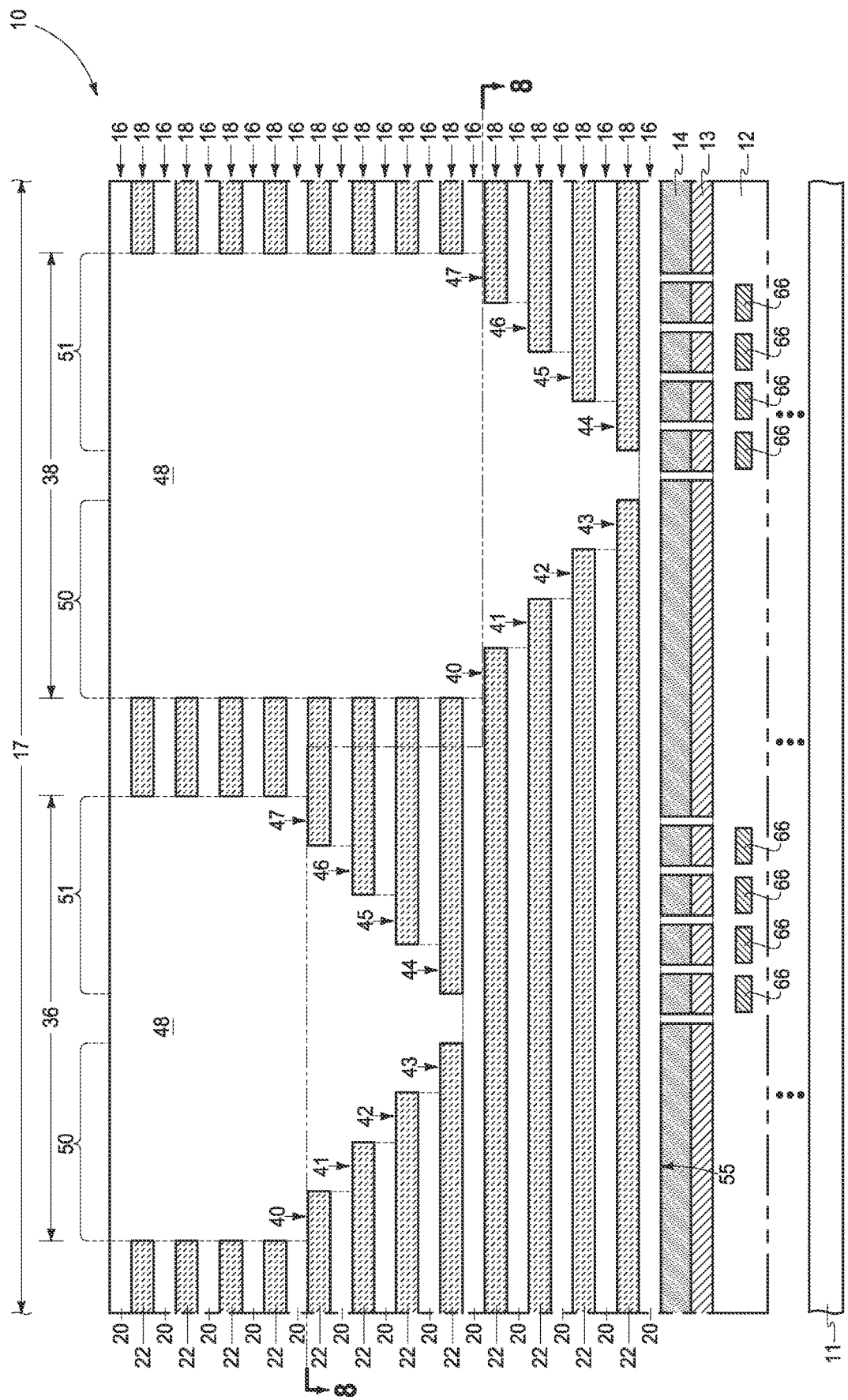
FIG. 10 is a view taken through line 10-10 in FIG. 8.

The discussion proceeds with reference to stair step structures 36 and 38 which, by way of example only, are subsequently referred to as first stair step structure 36 and adjacent second stair step structure 38. Referring to FIGS. 8-10, elevationally-extending dummy-structure openings 56 have been formed through insulating material 48 and vertically-alternating tiers 16 and 18 in adjacent portion 17. Dummy-structure openings 56 individually extend elevationally through one of steps 40-47 at least to a bottom 55 of vertically-alternating tiers 16, 18. Elevationally-extending via openings 54 have also been formed through insulating material 48 and vertically-alternating tiers 16, 18 in adjacent portion 17. Via openings 54 individually extend elevationally through one of steps 40-47 at least to bottom 55 of vertically-alternating tiers 16, 18. In one embodiment, dummy-structure openings 56 and via openings 54 are formed at the same time (i.e., simultaneously). Regardless, in one embodiment, dummy-structure openings 56 and via openings 54 are formed using a single masking step (e.g., using masking material [not shown] formed atop structure 10). In one embodiment, dummy-structure openings 56 and via openings 54 are formed to be of the same size and shape relative one another. Openings 54 and 56 are shown as being collectively arrayed in straight-line rows and columns. However, any alternate configuration may be used including, for example, staggering (not shown) alternating openings 54/56 in rows and/or columns.

Operative conductive vias 58 have been formed within via openings 54, thereby individually extending elevationally through insulating material 48, through one of steps 40-47, and through vertically-alternating tiers 16, 18 of first and second stacks 24, 30, respectively, at least to bottom 55 of vertically-alternating tiers 16, 18. Dummy structures 60 have been formed within dummy openings 56, thereby also individually extending elevationally through insulating material 48, through vertically-alternating tiers 16, 18, and through one of steps 40-47 at least to bottom 55 of vertically-alternating tiers 16, 18. In one embodiment, operative conductive vias 58 and dummy structures 60 are formed at the same time. In one embodiment and as shown, dummy structures 60 and operative conductive vias 58 are formed to comprise an insulative lining 62 (e.g., silicon dioxide and/or silicon nitride) and a conductive core 64 (e.g., metal material). In one embodiment, insulative linings 62 and conductive cores 64 in dummy-structure openings 56 and in via openings 54 are formed at the same time.

The operative conductive vias individually electrically couple to an electronic component that is below the vertically-alternating tiers. By way of example only, conductive lines 66 (example electronic components) are shown below conductive material 13, with each example operative conductive via 58 being electrically coupled to one of lines 66. For example. and by way of example only, FIG. 9 shows some alternate ones of operative conductive vias 58 directly electrically coupling to individual conductive lines 66 through source material 14, conductive material 13, and conductive vias 67. Another some alternate ones of operative conductive vias 58 directly electrically couple to individual conductive lines 66 by extending completely through materials 14 and 13 to be directly against individual conductive lines 66. The depicted features comprising materials 14, 13, 67, and 66 may comprise portions of respective pass transistors or other devices, and by way of examples only.

After forming dummy structures 60 and operative conductive vias 58, at least a majority of second material 22, in one embodiment all of second material 22, is etched away from the respective stair step structures. In one embodiment, at least a majority of second material 22, in one embodiment all of second material 22, is replaced with conductive material (e.g., whereby stair step structure 17 is fully metallized).

Figure 11:
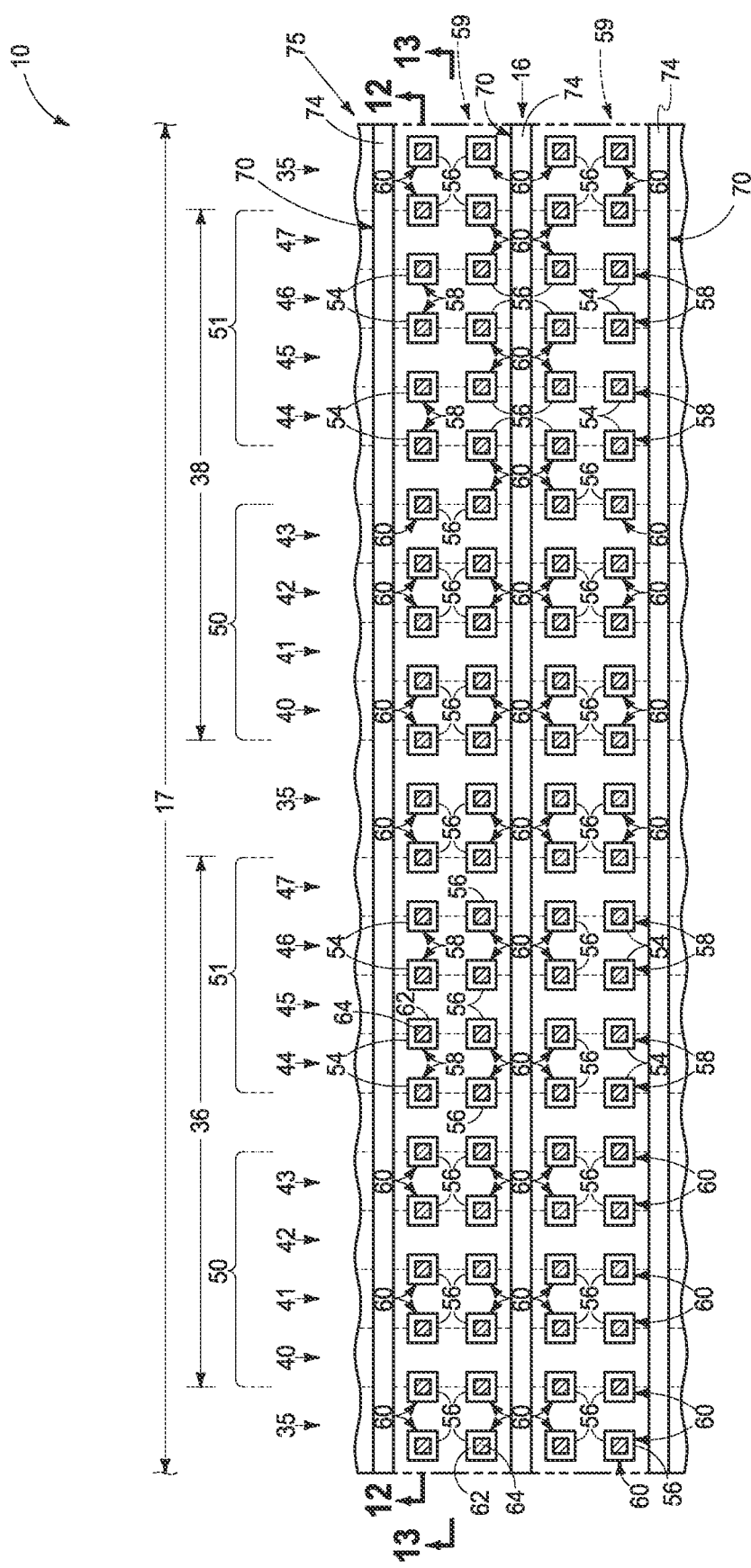
FIG. 11 is a view of the FIG. 8 construction at a processing step subsequent to that shown by FIG. 8, and is taken through line 11-11 in FIGS. 12 and 13.
Figure 12:
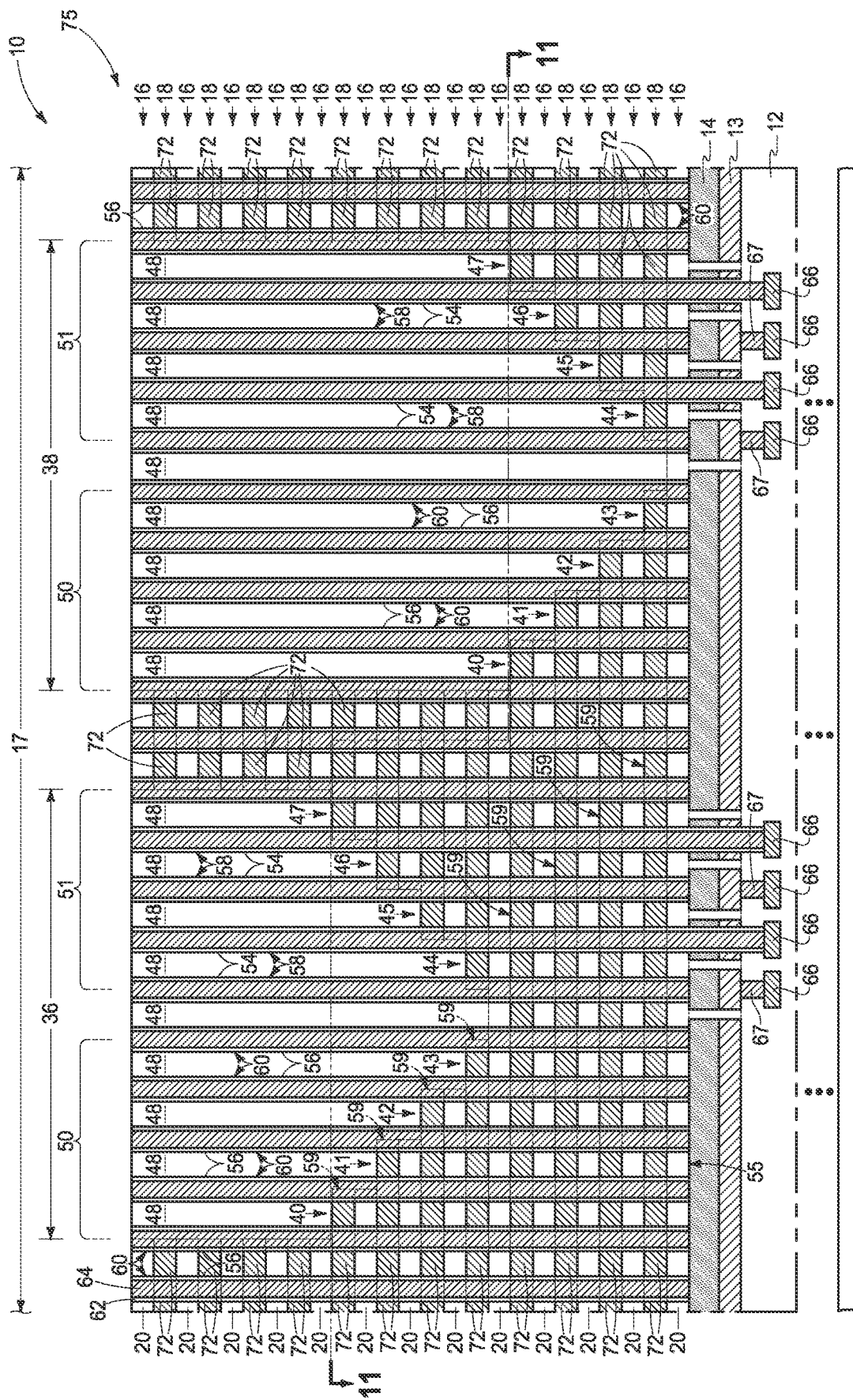
FIG. 12 is a view taken through line 12-12 in FIG. 11.
Figure 13:
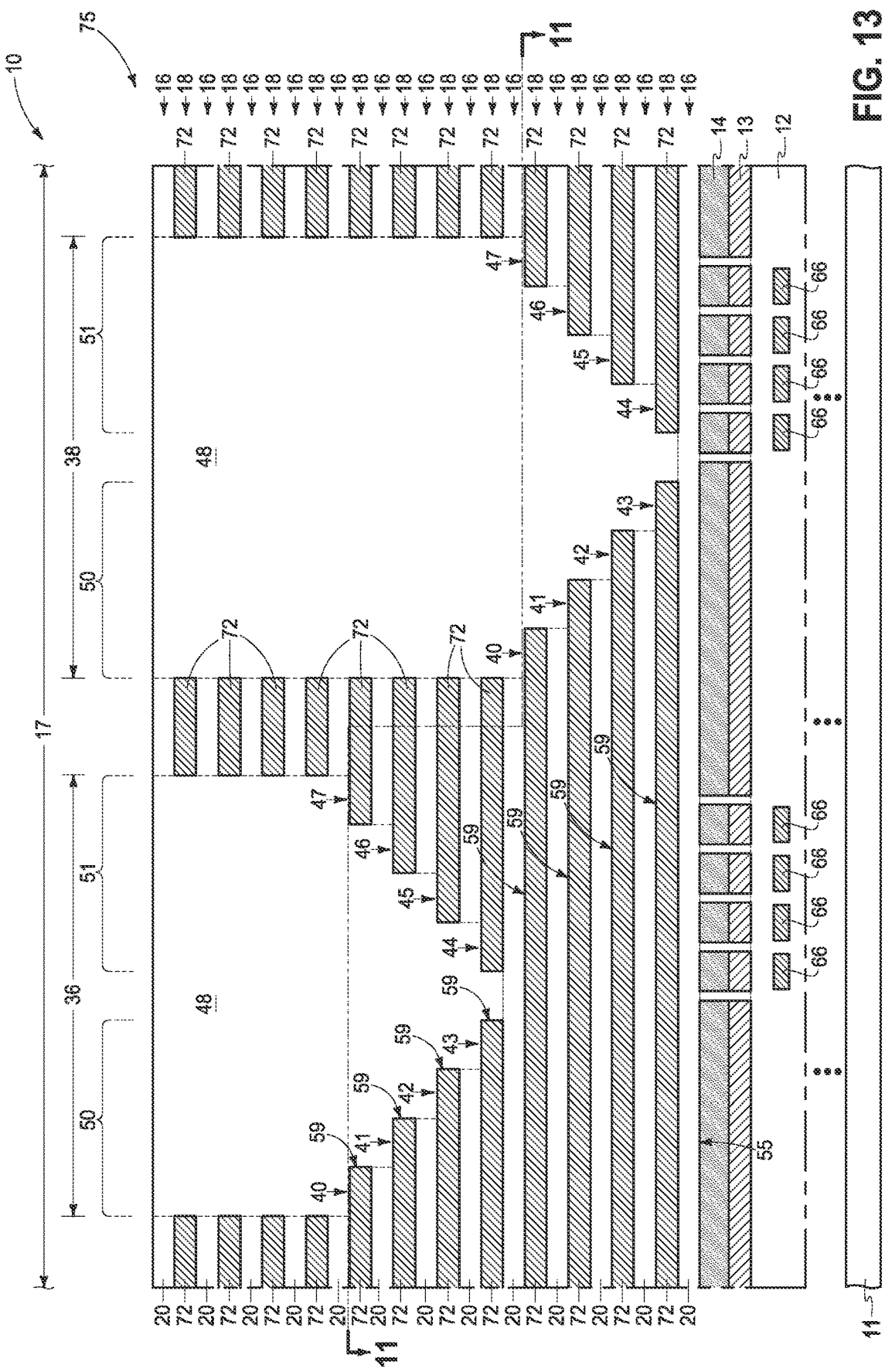
FIG. 13 is a view taken through line 13-13 in FIG. 11.

For example in the depicted embodiment, and referring to FIGS. 11-13, horizontally-elongated trenches 70 (e.g., stack slots) have been formed to extend elevationally into vertically-alternating tiers 16, 18. Thereafter, an etchant has been flowed through trenches 70 to second material 22 (not shown) to etch away at least a majority thereof from stair step structures 36, 38. Such may thereby temporarily effectively leave void space (not shown) elevationally between first material tiers 20, with such tiers being elevationally supported and prevented from collapsing within array portion 15 by transistor material 32 and by both dummy-support structures 60 and operative conductive vias 58 within the stair step structures in adjacent portion 17. FIGS. 11-13 show the void space (not shown) resulting from etching away material 22 (not shown) as having been filled with conductive material 72 (e.g., metal material). Steps 40-47 now comprise conductive steps due to presence of conductive material 72 and that are at least partially elevationally separated from one another by insulative material 20.

Figure 14:
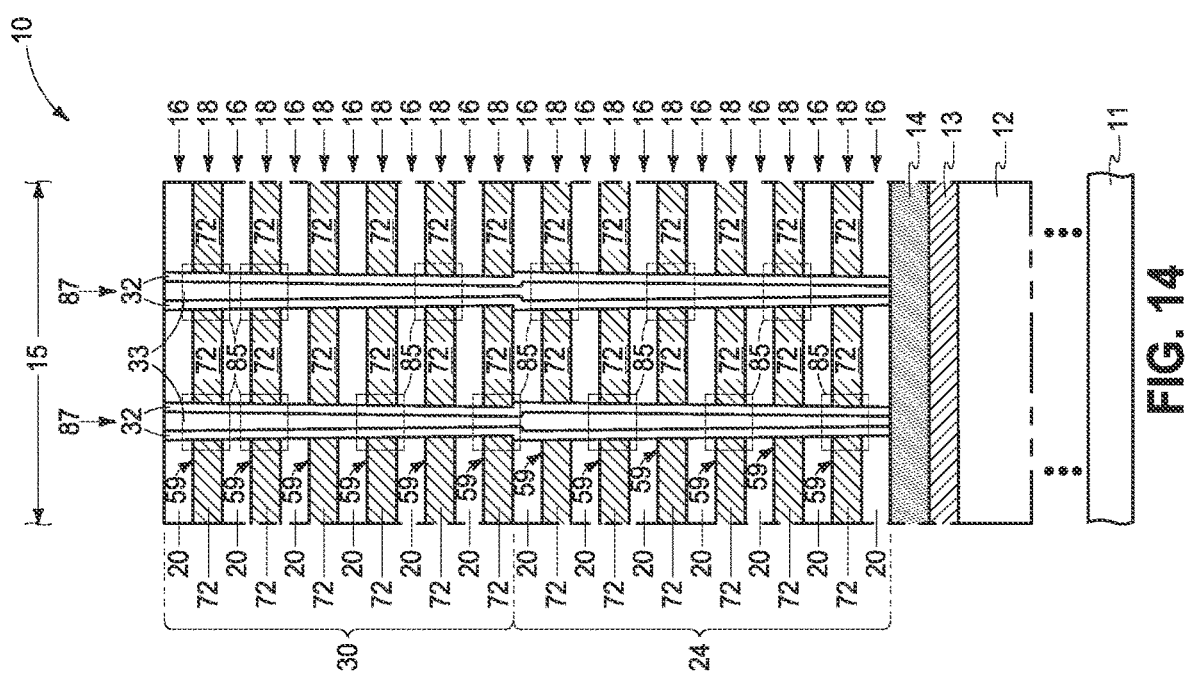
FIG. 14 is a cross-sectional view of part of the FIG. 1 portion of the substrate construction commensurate in processing with that of FIG. 11.
Figure 15:
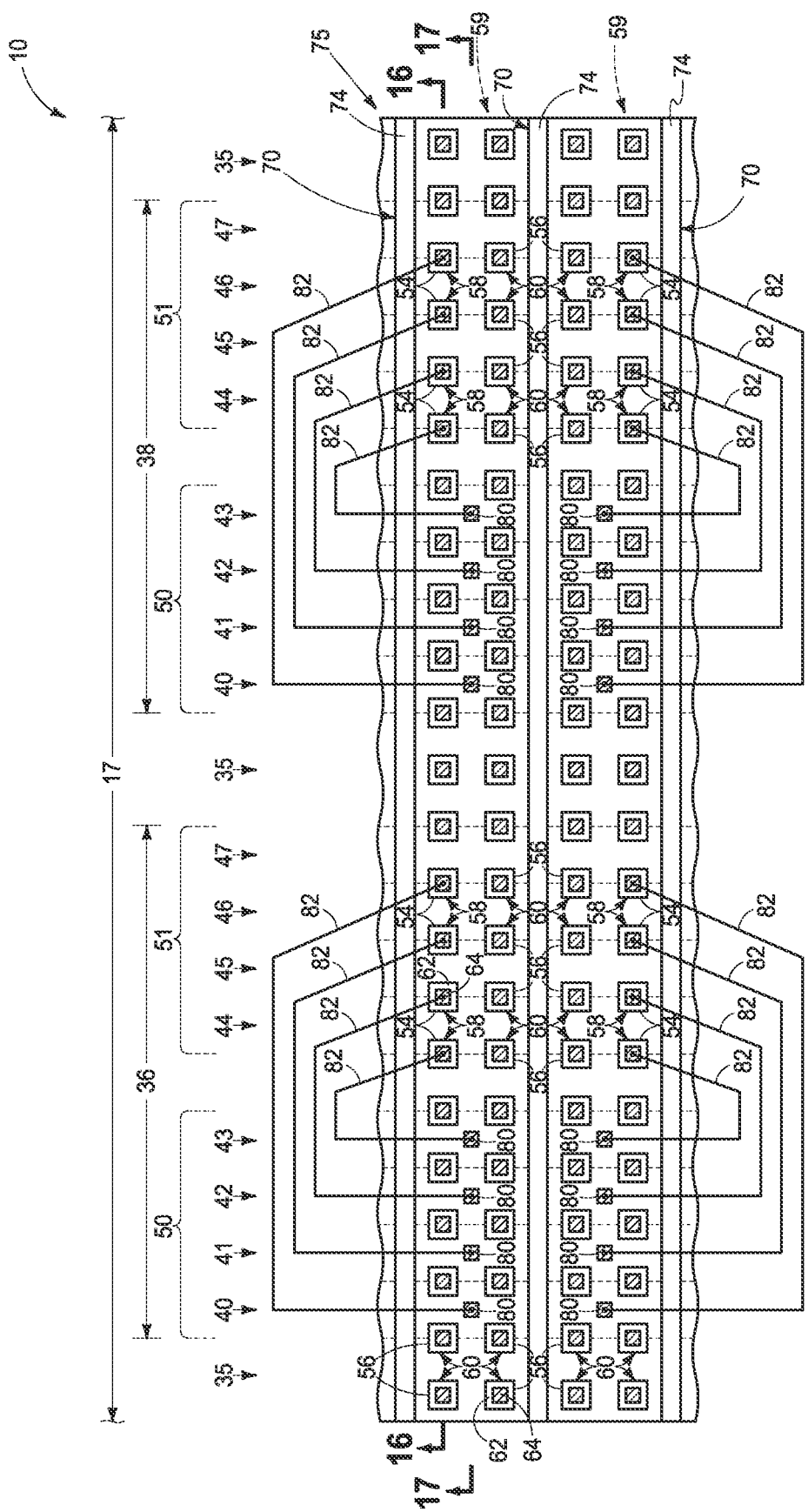
FIG. 15 is a view of the FIG. 11 construction at a processing step subsequent to that shown by FIG. 11, and is taken through line 15-15 in FIGS. 16 and 17.
Figure 16:
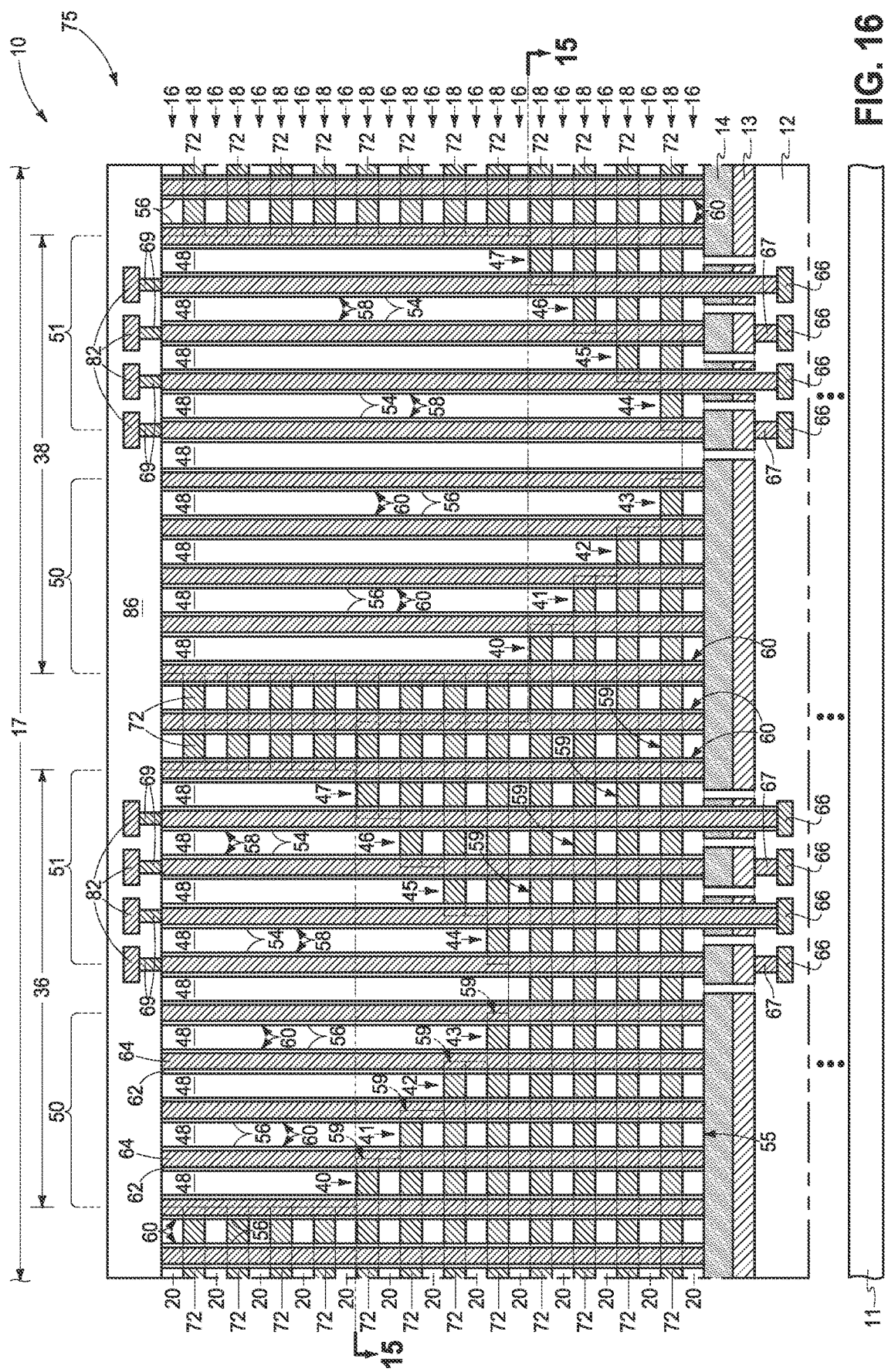
FIG. 16 is a view taken through line 16-16 in FIG. 15.
Figure 17:
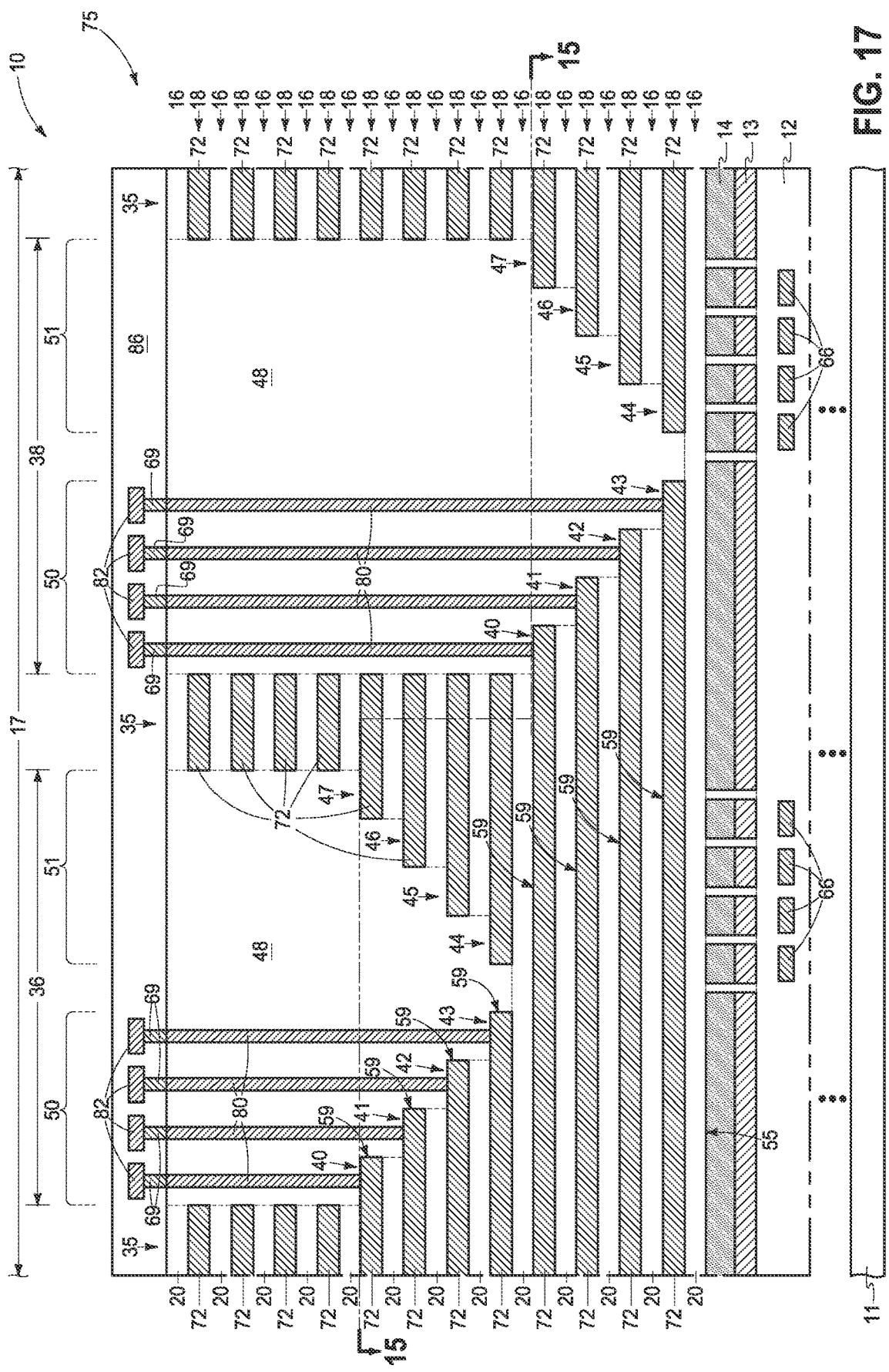
FIG. 17 is a view taken through line 17-17 in FIG. 15.
Figure 18:
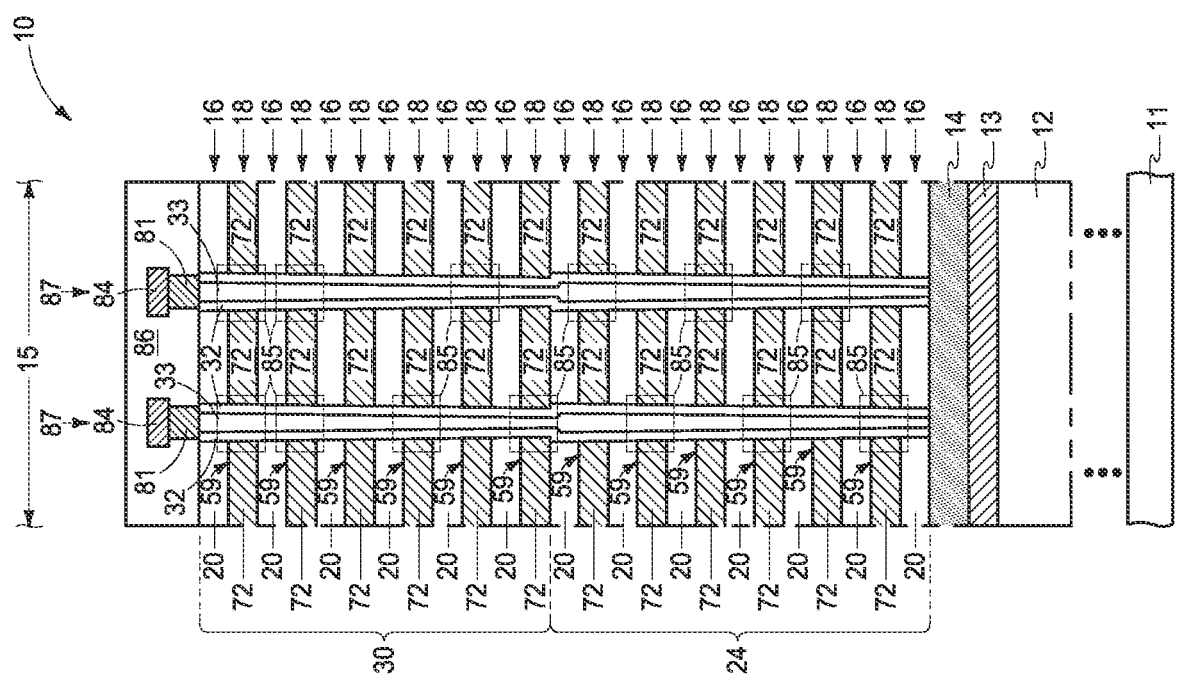
FIG. 18 is a cross-sectional view of the FIG. 14 portion of the substrate construction commensurate in processing with that of FIG. 15.

FIG. 14 analogously shows replacement of second material 22 (not shown) with conductive material 72 in array portion 15. Such has formed individual elevationally-extending transistors 85 (e.g., memory cells 85), for example within strings 87 individually shown as having twelve transistors 85.

Still referring to FIGS. 11-13, conductive material 72 would also likely fill (not shown) trenches 70 in array portion 15 (and in adjacent portion 17). Conductive material 72 could then be anisotropically etched from trenches 70. Then, trenches 70 have been filled with dielectric material 74. Accordingly, and by way of example only in one embodiment, horizontally-elongated trenches 70 form longitudinal outlines of access lines 59 extending from array portion 15 into adjacent portion 17 to individual steps 40-43 of flights 50. Access lines 59 may be of alternate width and/or shape in array portion 15 compared to adjacent portion 17 (not shown). Regardless, the depicted adjacent/staircase portion 17 may be considered as comprising a circuit structure 75 (i.e., an assemblage of electronic components) that is adjacent and electrically coupled to elevationally-extending transistors 85 of array portion 15.

The above-described processing may be termed by people of skill in the art as "replacement gate" and/or "gate-last" processing. Regardless, trenches 70 may be longitudinally continuous or longitudinally discontinuous (not shown), may comprise conductive material therein (not shown), may extend elevationally through all of tiers 16 and 18, may extend elevationally through only some of tiers 16 and 18, etc.

One or more of the stair step structures (e.g., stair step structure 34 in FIGS. 6 and 7) may comprise select gates (e.g., separate from access lines 59 and not shown). For example, stair step structure 34 may be configured as a select gate drain (SGD) structure for communicating with transistors 85 and may be coupled by select gates of a SGD control unit below tiers 16 and 18 in adjacent portion 17. Such a SGD structure may be separate from all other stair step structures, or formed as a portion (e.g., an upper portion) of one stair step structure. For example, the uppermost steps of the stair step structure closest to array portion 15 (e.g., steps 40+ in flight 50 of structure 34) may comprise landing pads of an SGD structure where remaining steps act as landing pads for differing electrical connections (e.g. contact portions/steps for access lines).

Referring to FIGS. 15-18, and in one embodiment, operating conducting vias 80 have been formed which individually extend elevationally to and directly electrically couple with conductive material 72 of one of conductive steps 40-47. Interconnect lines 82 have been formed above stair step structures 36 and 38 and individually directly electrically couple together different individual operating conducting vias 80 to different individual operative conductive vias 58 through conductive extensions 69. Interconnect lines 82 are shown schematically in FIG. 15. Strings 87 of transistors 85 may connect with individual conductive lines 84 through conductive extensions 81. Insulator material 86 (e.g., silicon nitride and/or silicon dioxide) is shown surrounding components 69, 82, 81, and 84.

Embodiments of the invention also encompass devices independent of method of manufacture. However, any of the structural attributes described above with respect to method embodiments may be found in structural aspects of the invention and vice versa.

An embodiment of the invention includes a device comprising an array (e.g., 15) of elevationally-extending transistors (e.g., 85). Such a device also comprises a circuit structure (e.g., 75) adjacent and electrically coupled to the elevationally-extending transistors of the array. The circuit structure comprises a stair step structure (e.g., any of 34, 36, and 38) comprising vertically-alternating tiers (e.g., 16, 18) comprising conductive steps (e.g., 40-47 in FIGS. 16 and 17) that are at least partially elevationally separated from one another by insulative material (e.g., 20). Operative conductive vias (e.g., 58) individually extend elevationally through one of the conductive steps at least to a bottom (e.g., 55) of the vertically-alternating tiers and which individually electrically couple to an electronic component (e.g., one or more of 14, 13, and 66) below the vertically-alternating tiers. Dummy structures (e.g., 60) individually extend elevationally through one of the conductive steps at least to the bottom of the vertically-alternating tiers.

The dummy structures may individually be conductive top-to-bottom through the vertically-alternating tiers. The operative conductive vias and the dummy structures may individually be of the same peripheral size and peripheral shape. The operative conductive vias and the dummy structures may individual comprise a conductive core (e.g., 64) and an insulative periphery (e.g., 62). The conductive cores and the insulative peripheries in the operative conductive vias and the dummy structures may individually extend at least top-to-bottom through the vertically-alternating tiers.

The operative conductive vias may individually extend elevationally through more than one of the conductive steps. In one such embodiment, the operative conductive vias may individually extend elevationally through multiple of the conductive steps, in one such embodiment through no more than two of the conductive steps, and in one such embodiment individually extend elevationally through equal surface areas of the two conductive steps through which the operative conductive vias elevationally extend. For example, and by way of example only, the operative conductive vias in FIGS. 15-17 individually overlap two immediately-adjacent steps and extend through equal surface areas of each such step.

The dummy structures may individually extend elevationally through more than one of the conductive steps. In one such embodiment, the dummy structures may individually extend elevationally through multiple of the conductive steps, in one such embodiment through no more than two of the conductive steps, and in one such embodiment individually extend elevationally through equal surface areas of the two conductive steps through which the dummy structures elevationally extend. For example, and by way of example only, the dummy structures in FIGS. 15-17 individually overlap two immediately-adjacent steps and extend through equal surface areas of each such step.

In one embodiment, operating conducting vias (e.g., 80) individually extend elevationally to and directly electrically couple with conductive material (e.g., 72) of one of the conductive steps. Individual of the operative conducting vias and individual of the operative conductive vias are directly electrically coupled to one another by an interconnect line (e.g., 82) that is above the stair step structure.

In one embodiment, one of the operative conductive vias and one of the dummy structures are side-by-side and extend elevationally through the same one of the conductive steps, and in one such embodiment, the one operative conductive via and the one dummy structure also extend elevationally through another same one of the conductive steps. For example, and by way of example only, an operative conductive via 58 and a dummy structure 60 are side-by-side in an access line 59 with respect to steps 46 and 47 and satisfy such criteria.

In one embodiment, one of the conductive steps (e.g., any of 40, 41, 42, or 43) comprises conductive material that extends into the array and which electrically couples to some of the transistors in the array. Another of the conductive steps (e.g., any of 44, 45, 46, or 47) comprises conductive material that does not extend into the array and which does not electrically couple to any transistor in the array.

Any other attribute(s) or aspect(s) as shown and/or described herein with respect to other embodiments may be used.

In one embodiment, a device comprises an array of elevationally-extending transistors and a circuit structure adjacent and electrically coupled to the elevationally-extending transistors of the array. The circuit structure comprises a first stair step structure (e.g., 36) and an adjacent second stair step structure (e.g., 38) individually comprising vertically-alternating tiers comprising first and second opposing flights (e.g., 50, 51) of conductive steps. The conductive steps are at least partially elevationally separated from one another by insulative material in each of the first and second stair step structures. An elevationally-outer landing (e.g., 35) is between the first stair step structure and the second stair step structure. Operative conductive vias are in each of the first and second stair step structures, and individually extend elevationally through one of the conductive steps at least to a bottom of the vertically-alternating tiers of the respective first or second stair step structure. The operative conductive vias individually electrically couple to an electronic component below the vertically-alternating tiers of the respective first or second stair step structures. First dummy structures (e.g., certain structures 60) are in each of the first and second stair step structures, and individually extend elevationally through one of the conductive steps at least to the bottom of the vertically-alternating tiers of the respective first or second stair step structure. A second dummy structure (e.g., certain of structures 60) extends elevationally through the landing. Any other attribute(s) or aspect(s) as shown and/or described herein with respect to other embodiments may be used.

In one embodiment, a device comprises an array of elevationally-extending transistors and a circuit structure adjacent and electrically coupled to the elevationally-extending transistors of the array. The circuit structure comprises a stair step structure comprising vertically-alternating tiers comprising first and second opposing flights of conductive steps. The conductive steps are at least partially elevationally separated from one another by insulative material. Operative conductive vias individually extend elevationally through one of the conductive steps at least to a bottom of the vertically-alternating tiers. The operative conductive vias individually electrically couple to an electronic component below the vertically-alternating tiers. First-flight-dummy structures (e.g., 60 in a flight 50) individually extend elevationally through one of the first-flight conductive steps (e.g., any of 40, 41, 42, or 43) at least to the bottom of the vertically-alternating tiers. Second-flight-dummy structures (e.g., 60 in a flight 51) individually extend elevationally through one of the second-flight conductive steps (e.g., any of 44, 45, 46, or 47) at least to the bottom of the vertically-alternating tiers. In one embodiment, the first and second flights have the same total number of steps. In one embodiment, the operative conductive vias extend elevationally only through the steps in one of the first or second flights and not in the other of the first and second flights. Any other attribute(s) or aspect(s) as shown and/or described herein with respect to other embodiments may be used.

In one embodiment, a device comprises an array of elevationally-extending transistors and a circuit structure adjacent and electrically coupled to the elevationally-extending transistors of the array. The circuit structure comprises a first stair step structure and an adjacent second stair step structure individually comprising vertically-alternating tiers comprising first and second opposing flights of conductive steps. The conductive steps are at least partially elevationally separated from one another by insulative material in each of the first and second stair step structures. Operative conductive vias are in each of the first and second stair step structures, and individually extend elevationally through one of the conductive steps at least to a bottom of the vertically-alternating tiers of the respective first or second stair step structure. The operative conductive vias individually electrically couple to an electronic component below the vertically-alternating tiers of the respective first or second stair step structure. First-flight-dummy structures are in each of the first and second stair step structures and individually extend elevationally through one of the first-flight conductive steps in the respective first or second stair step structures at least to the bottom of the vertically-alternating tiers of the respective first or second stair step structures. Second-flight-dummy structures are in each of the first and second stair step structures, and individually extend elevationally through one of the second-flight conductive steps in the respective first or second stair step structure at least to the bottom of the vertically-alternating tiers of the respective first and second stair step structure. Any other attribute(s) or aspect(s) as shown and/or described herein with respect to other embodiments may be used.

In some embodiments, any one or more of the elevationally-extending features is formed to be vertical or within 10° of vertical.

Any of the attributes as disclosed in U.S. Pat. No. 9,589,978 and/or in U.S. patent application Ser. No. 15/068,329 filed Mar. 11, 2016 may be used.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extending elevationally" refer to a direction that is angled away by at least 45° from exactly horizontal. Further, "extend(ing) elevationally" and "elevationally-extending" with respect to a field effect transistor are with reference to orientation of the transistor's channel length along which current flows in operation between the source/drain regions. For bipolar junction transistors, "extend(ing) elevationally" and "elevationally-extending" are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region (s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

In this document, a selective etch or removal is an etch or removal where one material is removed relative to another stated material or materials at a rate of at least 2.0:1.

In this document, a "dummy structure" refers to a structure which is used to mimic a physical property of another structure (e.g., presence, or physical load-carrying/supporting ability of an operative structure) and which may comprise a circuit inoperable electrical dead end (e.g., is not part of a current flow path of a circuit even if conductive). Openings in which dummy structures are formed may be considered as "dummy-structure openings".

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A device comprising:
    an array of elevationally-extending transistors; and
    a circuit structure adjacent and electrically coupled to the elevationally-extending transistors of the array, the circuit structure comprising:
        a stair step structure comprising vertically-alternating tiers comprising conductive steps that are at least partially elevationally separated from one another by insulative material;
        operative conductive vias individually extending elevationally through one of the conductive steps at least to a bottom of the vertically-alternating tiers and which individually electrically couple to an electronic component below the vertically-alternating tiers; and
        dummy structures individually extending elevationally through one of the conductive steps at least to the bottom of the vertically-alternating tiers, the operative conductive vias and the dummy structures individually comprising a conductive core and an insulative periphery.

2. The device of claim 1 wherein the dummy structures are individually conductive top-to-bottom through the vertically-alternating tiers.

3. The device of claim 1 wherein the operative conductive vias and the dummy structures are individually of the same peripheral size and peripheral shape.

4. The device of claim 1 wherein the conductive cores and the insulative peripheries in the operative conductive vias and the dummy structures individually extend top-to-bottom through the vertically-alternating tiers.

5. The device of claim 1 wherein the operative conductive vias individually extend elevationally through more than one of the conductive steps.

6. The device of claim 5 wherein the operative conductive vias individually extend elevationally through no more than two of the conductive steps.

7. The device of claim 6 wherein the operative conductive vias individually extend elevationally through equal surface areas of the two conductive steps through which the operative conductive vias elevationally extend.

8. The device of claim 1 wherein the dummy structures individually extend elevationally through more than one of the conductive steps.

9. The device of claim 8 wherein the dummy structures individually extend elevationally through no more than two of the conductive steps.

10. The device of claim 9 wherein the dummy structures individually extend elevationally through equal surface areas of the two conductive steps through which the dummy structures elevationally extend.

11. The device of claim 1 comprising operative conducting vias individually extending elevationally to and directly electrically coupling with conductive material of one of the conductive steps, individual of the operative conducting vias and individual of the operative conductive vias being directly electrically coupled to one another by an interconnect line that is above the stair step structure.

12. The device of claim 1 wherein one of the operative conductive vias and one of the dummy structures are side-by-side and extend elevationally through the same one of the conductive steps.

13. The device of claim 12 wherein the one operative conductive via and the one dummy structure also extend elevationally through another same one of the conductive steps.

14. The device of claim 1 wherein two of the dummy structures are side-by-side and extend elevationally through the same one of the conductive steps.

15. The device of claim 14 wherein the two dummy structures also extend elevationally through another same one of the conductive steps.

16. The device of claim 1 wherein the elevationally-extending transistors are memory cells.

17. A device comprising:
an array of elevationally-extending transistors; and
a circuit structure adjacent and electrically coupled to the elevationally-extending transistors of the array, the circuit structure comprising:
   a stair step structure comprising vertically-alternating tiers comprising conductive steps that are at least partially elevationally separated from one another by insulative material, one of the conductive steps comprising conductive material that extends into the array and which electrically couples to some of the transistors in the array, another of the conductive steps comprising conductive material that does not extend into the array and which does not electrically couple to any transistor in the array;
   operative conductive vias individually extending elevationally through one of the conductive steps at least to a bottom of the vertically-alternating tiers and which individually electrically couple to an electronic component below the vertically-alternating tiers; and
   dummy structures individually extending elevationally through one of the conductive steps at least to the bottom of the vertically-alternating tiers.

18. A device comprising:
an array of elevationally-extending transistors; and
a circuit structure adjacent and electrically coupled to the elevationally-extending transistors of the array, the circuit structure comprising:
   a first stair step structure and an adjacent second stair step structure individually comprising vertically-alternating tiers comprising first and second opposing sets of conductive steps, the conductive steps being at least partially elevationally separated from one another by insulative material in each of the first and second stair step structures;
   an elevationally-outer landing between the first stair step structure and the second stair step structure;
   operative conductive vias in each of the first and second stair step structures, the operative conductive vias individually extending elevationally through one of the conductive steps at least to a bottom of the vertically-alternating tiers of the respective first or second stair step structure and which individually electrically couple to an electronic component below the vertically-alternating tiers of the respective first or second stair step structure;
   first dummy structures in each of the first and second stair step structures, the first dummy structures individually extending elevationally through one of the conductive steps at least to the bottom of the vertically-alternating tiers of the respective first or second stair step structure; and
   a second dummy structure extending elevationally through the landing.

19. The device of claim 18 comprising multiple of the second dummy structures individually extending elevationally through the landing.

20. A device comprising:
an array of elevationally-extending transistors; and
a circuit structure adjacent and electrically coupled to the elevationally-extending transistors of the array, the circuit structure comprising:
   a stair step structure comprising vertically-alternating tiers comprising first and second opposing flights of conductive steps, the conductive steps being at least partially elevationally separated from one another by insulative material;
   operative conductive vias individually extending elevationally through one of the conductive steps at least to a bottom of the vertically-alternating tiers and which individually electrically couple to an electronic component below the vertically-alternating tiers, the operative conductive vias extending elevationally only through the steps in one of the first or second flights and not in the other of the first and second flights;
   first-flight-dummy structures individually extending elevationally through one of the first-flight conductive steps at least to the bottom of the vertically-alternating tiers; and
   second-flight-dummy structures individually extending elevationally through one of the second-flight conductive steps at least to the bottom of the vertically-alternating tiers.

21. The device of claim 20 wherein the first and second steps have the same total number of steps.

22. A device comprising:
an array of elevationally-extending transistors comprising memory cells; and
a circuit structure adjacent and electrically coupled to the elevationally-extending transistors of the array, the circuit structure comprising:
   a first stair step structure and an adjacent second stair step structure individually comprising vertically-alternating tiers comprising first and second opposing flights of conductive steps, the conductive steps being at least partially elevationally separated from one another by insulative material in each of the first and second stair step structures;
   operative conductive vias in each of the first and second stair step structures, the operative conductive vias individually extending elevationally through one of the conductive steps at least to a bottom of the vertically-alternating tiers of the respective first or second stair step structure and which individually electrically couple to an electronic component below the vertically-alternating tiers of the respective first or second stair step structure;
   first-flight-dummy structures in each of the first and second stair step structures, the first-flight-dummy structures individually extending elevationally through one of the first-flight conductive steps in the respective first or second stair step structure at least to the bottom of the vertically-alternating tiers of the respective first or second stair step structure; and
   second-flight-dummy structures in each of the first and second stair step structures, the second-flight-dummy structures individually extending elevationally through one of the second-flight conductive steps in the respective first or second stair step structure at least to the bottom of the vertically-alternating tiers of the respective first or second stair step structure.

* * * * *